United States Patent

Tang et al.

Patent Number: 5,485,423
Date of Patent: Jan. 16, 1996

[54] METHOD FOR ELIMINATING OF CYCLING-INDUCED ELECTRON TRAPPING IN THE TUNNELING OXIDE OF 5 VOLT ONLY FLASH EEPROMS

[75] Inventors: Yuan Tang, San Jose; Chi Chang, Redwood City; Michael A. Van Buskirk, San Jose; Chung K. Chang, Sunnyvale, all of Calif.

[73] Assignee: Advanced Micro Devices, Inc., Sunnyvale, Calif.

[21] Appl. No.: 320,368

[22] Filed: Oct. 11, 1994

[51] Int. Cl.⁶ .................................................. G11C 13/00
[52] U.S. Cl. .................................................. 365/185
[58] Field of Search .................................. 365/185, 900, 365/218

[56] References Cited

U.S. PATENT DOCUMENTS

| | | | |
|---|---|---|---|
| 4,434,478 | 2/1984 | Cook et al. | 365/185 |
| 5,042,009 | 8/1991 | Kazeroumiam et al. | 365/185 |
| 5,315,547 | 5/1994 | Shaji et al. | 36 T/900 X |

Primary Examiner—Do Hyun Yoo
Attorney, Agent, or Firm—Davis Chin

[57] ABSTRACT

There is provided an improved method for eliminating of cycling-induced electron trapping in the tunneling oxide of flash EEPROM devices. A relatively low positive pulse voltage is applied to a source region of the EEPROM devices during an entire erase cycle. Simultaneously, a negative ramp voltage is applied to a control gate of the EEPROM devices during the entire erase cycle so as to accomplish an averaging tunneling field from the beginning of the erase cycle to the end of the erase cycle.

10 Claims, 3 Drawing Sheets

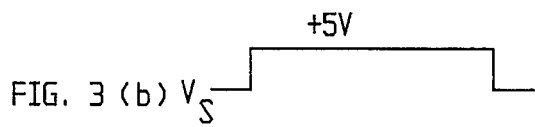
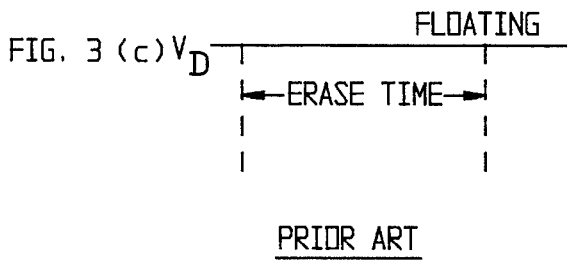
PRIOR ART
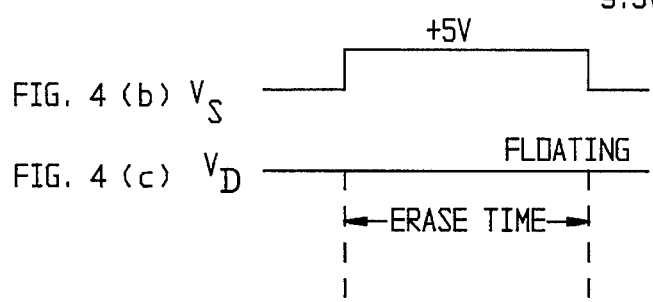
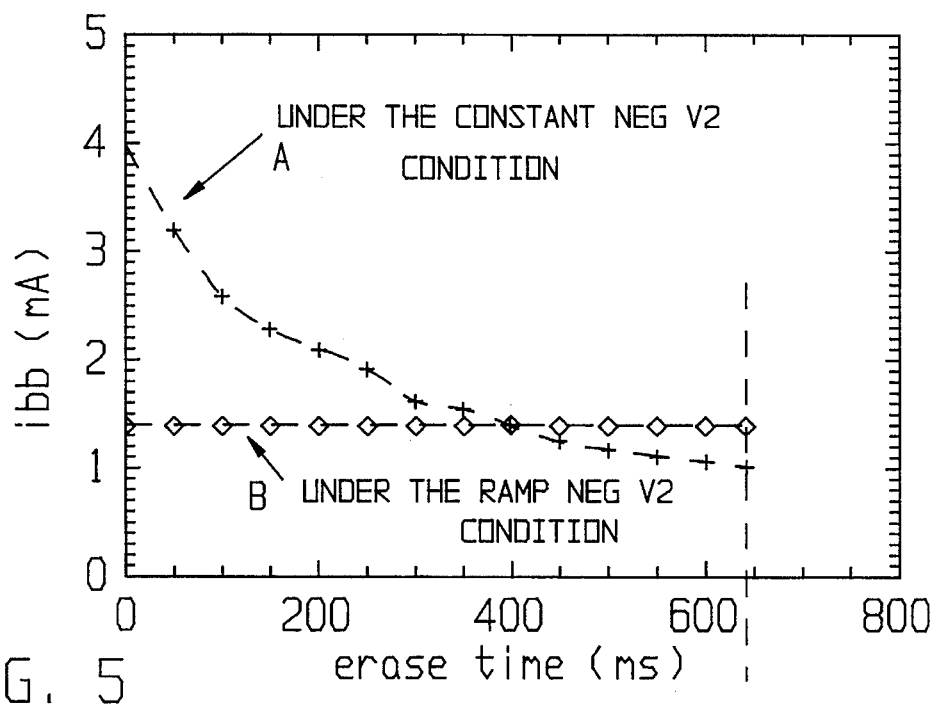
FIG. 5

METHOD FOR ELIMINATING OF CYCLING-INDUCED ELECTRON TRAPPING IN THE TUNNELING OXIDE OF 5 VOLT ONLY FLASH EEPROMS

BACKGROUND OF THE INVENTION

This invention relates generally to floating gate memory devices such as an array of flash electrically erasable and programmable read-only memory devices (EEPROMs). More particularly, the present invention is directed to a new and improved method for eliminating of cycling-induced electron trapping in the tunneling oxide of 5 volt only flash EEPROMs.

As is generally known in the art, there exists a class of non-volatile memory devices referred to as "flash EEPROMs" which has recently emerged as an important memory device by combining the advantages of EPROM density with EEPROM electrical erasability. Such flash EEPROMs provide electrical erasing and a small cell size. FIG. 1 illustrates a prior art cross-sectional view of a flash EEPROM cell 10. The EEPROM cell is formed of a substrate 12, typically of a p-type conductivity, having embedded therein an $n^+$ drain region 14 and an n-type double-diffused source region 16. The double-diffused source region 16 is formed of a deeply diffused but lightly doped n-junction 18 and a more heavily doped but shallower $n^+$ junction 20 embedded within the deep n-junction 18. The deeply diffused n-junction 18 is typically formed by using a phosphorus implant, and the shallower $n^+$ junction 20 is typically formed by using an arsenic implant after the phosphorus implant.

A relatively thin gate dielectric layer 22 (i.e., oxide having a uniform thickness of about 100 Å) is interposed between the top surface of the substrate 12 and a conductive polysilicon floating gate 24. A polysilicon control gate 26 is insulatively supported above the floating gate 24 by an interpoly dielectric 28. A channel region 30 in the substrate 12 separates the drain region 14 and the source region 16. Further, there are provided terminal pins 15, 25, and 13 for applying a source voltage $V_S$ to the source region 16, a gate voltage $V_G$ to the control gate 26, and a drain voltage $V_D$ to the drain region 14, respectively.

According to conventional operation, the flash EEPROM cell of FIG. 1 is "programmed" by applying a relatively high voltage $V_G$ (approximately +9 volts) to the control gate via the terminal pin 25 and a moderately high voltage $V_D$ (approximately +5 volts) to the drain region 14 via the terminal pin 13 in order to produce "hot" (high energy) electrons in the channel 30 near the drain region 14. The source region 16 is connected to a ground potential ($V_S=0$) via the terminal pin 15. The hot electrons are generated and accelerated across the gate dielectric 22 and onto the floating gate 24 and become trapped in the floating gate since the floating gate is surrounded by insulators. As a result, the floating gate threshold may be increased by three to five volts. This change in the threshold voltage, or channel conductance, of the cell created by the trapped hot electrons is what causes the cell to be programmed.

In order to erase the flash EEPROM cell of FIG. 1, a positive voltage $V_S$ is applied to the source region 16 via the terminal pin 15 while the control gate 26 via the terminal pin 25 is either grounded ($V_G=0$) or biased to a negative voltage dependent upon whether the positive voltage $V_S$ applied to the source region 16 has a value of +12 V or +5 V. In a "12 Volt flash EEPROM" device, the bias condition of $V_S=+12$ V and $V_G=0$ is used. In a "5 Volt Only flash EEPROM" device, the bias condition of $V_S=+5$ V and $V_G=-8.5$ V is used. The drain region 14 is usually allowed to float. Under either of these conditions, a strong electric field is developed across the tunnel oxide between the floating gate and the source region. The electrons trapped in the floating gate flow toward a cluster at the portion of the floating gate overlying the $n^+$-type source region 16 and are extracted from the floating gate 24 to the source region 16 by way of Fowler-Nordheim (F-N) tunneling.

However, some of the electrons will remain trapped in the tunnel oxide adjacent the top surface of the substrate 12 as depicted in FIG. 1. This electron trapping will occur in the whole memory array and will tend to increase the erase time as a function of the number of program/erase cycles. As the number of program/erase cycles goes beyond the 100,000 number, the erase time required to erase every cell in the entire memory array to a certain threshold $V_T$ in order to pass the erase verify mode of operation will exceed the time limit of 10 seconds. It is generally assumed that if the entire memory array cannot be erased within the time limit of 10 seconds (i.e., 1 pulse/10 ms or 1,000 pulses), a cycling failure is considered to have occurred.

Therefore, the problem of electron trapping for such conventional EEPROM devices is of a major concern since it causes the erase time to be prolonged beyond the limit of 10 seconds, thereby significantly limiting the endurance of the cells. As used herein, the term "endurance" refers to the number of times the memory cells in the array may be re-programmed and erased. Consequently, the electron trapping problem greatly reduces the endurance of the cells to be less than 100,000.

The inventor has observed that the problem of electron trapping due to cycling did not occur in the 12 volt flash EEPROMs and was only a concern on the 5 Volt Only flash EEPROMs. By experimentation it was also found that in the 5 Volt Only EEPROM device the problem of electron trapping could not be prevented by simply reducing the tunneling field during the entire erase duration since the amount of erase time also has an effect on the electron trapping.

However, since the 12 Volt flash EEPROM device did not have the problem of electron trapping due to cycling, it was attempted to simulate the conditions on the 12 Volt flash EEPROM device on a 5 Volt flash EEPROM device by lowering the magnitude of the negative voltage on the control gate and increasing the voltage on the source through a load resistor. Thereafter, the 5 Volt flash device was cycled utilizing the condition of −5.5 volts applied to the control gate and +7 volts applied to the source via a 396 Ω load resistor through 30,000 cycles. The biases were so set because the erase time under same verify condition is about the same as the erase time under the typical present "5 Volt Only" erase condition (i.e., +5 V/−8.5 V/390 Ω) condition.

It was observed that under this condition (+7 V/−5.5 V/390 Ω) applied to the 5 Volt flash device, the erase time was slightly reduced (i.e., trapped electrons were being removed) for the first hundred cycles and remained substantially constant through 30,000 cycles. In other words, the problem of electron trapping had been eliminated.

By performing various measurements, it was determined that the tunneling electric field for the typical bias condition of −8.5 volts applied to the control gate and +5 volts applied to the source via the 396 Ω load resistor was higher at the beginning of the erase condition and lower towards the end of the erase condition as compared to the tunneling electric field under the condition of applying −5.5 volts on the control gate and +7.0 volts to the source through the same load resistor. As a result, the inventor has discovered that the problem of electron trapping can be reduced significantly or substantially eliminated by averaging the tunneling field throughout the erase duration.

SUMMARY OF THE INVENTION

Accordingly, it is a general object of the present invention to provide an improved method for eliminating of cycling-induced electron trapping in the tunneling oxide of flash EEPROMs which overcomes the disadvantages of the prior art erase methods.

It is an object of the present invention to provide an improved method for eliminating of cycling-induced electron trapping in the tunneling oxide of flash EEPROMs which is realized by applying a negative ramp voltage on the control gate throughout the erase duration.

It is another object of the present invention to provide an improved method for eliminating of cycling-induced electron trapping in the tunneling oxide of flash EEPROMs which is realized by applying a positive ramp voltage on the source throughout the erase condition.

It is still another object of the present invention to provide an improved method for eliminating of cycling-induced electron trapping in the tunneling oxide of flash EEPROMs which reduces significantly the peak substrate current throughout the erase duration.

It is still another object of the present invention to provide an improved method for eliminating of cycling-induced electron trapping in the tunneling oxide of flash EEPROMs which provide a tighter threshold $V_T$ distribution after erase and thus less column leakage.

In a preferred embodiment of the present invention, there is provided a method for eliminating of cycling-induced electron trapping in the tunneling oxide of flash EEPROMs devices. This is accomplished by applying a relatively low positive pulse voltage to a source region of the EEPROM devices during an entire erase cycle. Simultaneously, there is applied a negative ramp voltage to the control gate of the EEPROM devices during the entire erase cycle so as to achieve an averaging tunneling field from the beginning of the erase cycle to the end of the erase cycle.

In another aspect of the present invention, there is applied a positive ramp voltage to the source region of the EEPROM devices during the entire erase cycle simultaneously with a relatively low negative pulse voltage applied to the control gate.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIGS. 3(a)–3(c) are waveforms of the voltages applied to the respective control gate, source, and drain over the erase condition in accordance with the prior art;

FIGS. 4(a)–4(c) are waveforms of the voltages applied to the control gate, source, and drain over the erase condition, according to the present invention;

FIG. 5 is a plot of the band-to-band conduction currents as a function of the erase times for the constant bias condition and the negative ramp condition;

DESCRIPTION OF THE PREFERRED EMBODIMENT

Figure 1:
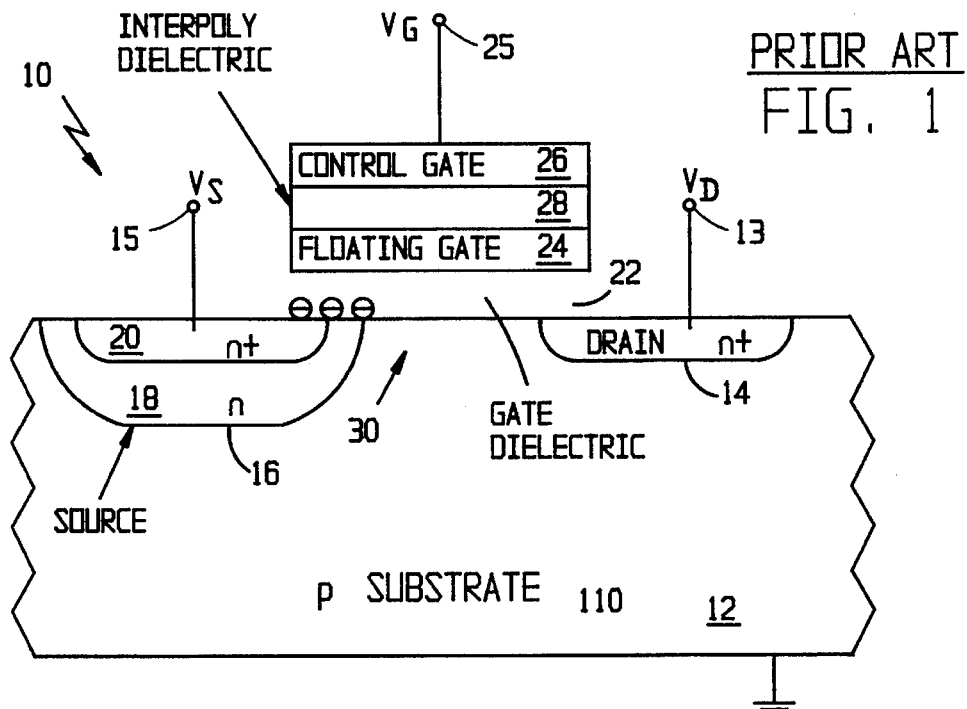
FIG. 1 shows a cross-sectional view of a conventional flash EEPROM cell, illustrating the trapped electrons in the tunneling oxide and has been labeled "Prior Art."
Figure 2:
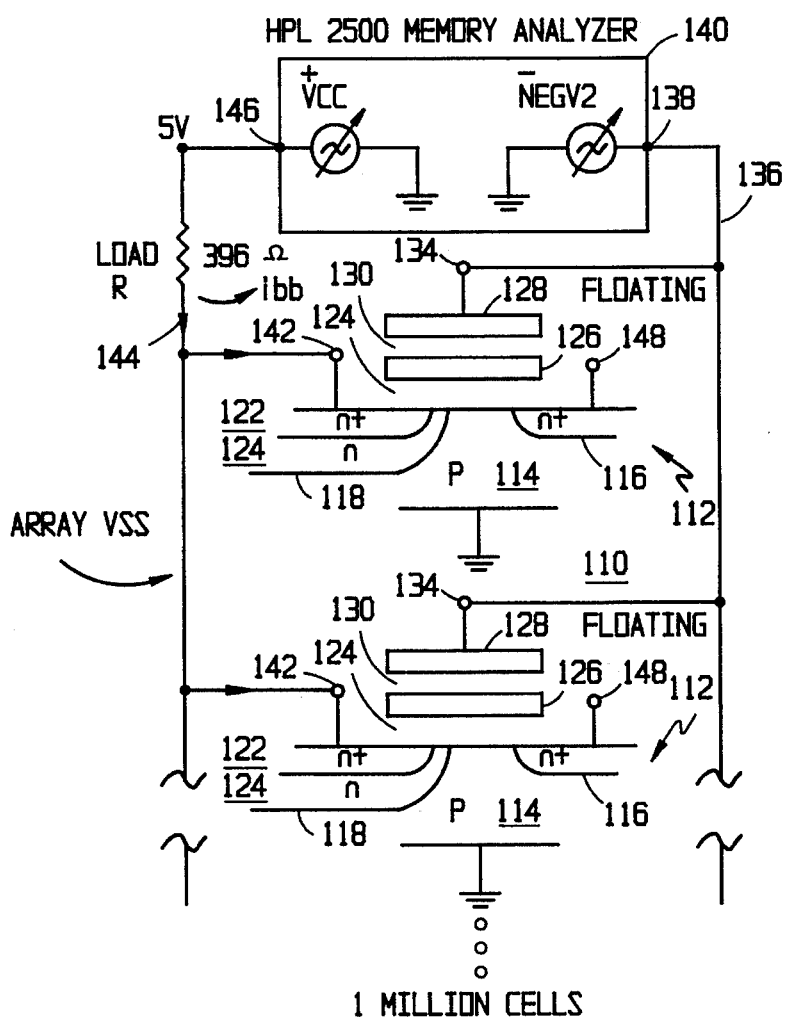
FIG. 2 illustrates a test set-up for the method for eliminating of cycling-induced electron trapping, according to the present invention.

Referring now in detail to the drawings, there is illustrated in FIG. 2 a test-up for the method for eliminating of cycling-induced electron trapping in the tunneling oxide of a 5 Volt Only flash EEPROM array 110, according to the present invention. The flash EEPROM array 110 is formed of a plurality of flash EEPROM cells 112 on a single integrated circuit chip arranged in an N×M matrix. It is to be understood that each of the memory cells 112 represents one of a large number, N×M (i.e., 1,048,856) of cells provided on the memory chip. For the sake of simplicity, only a portion of one column of the memory cells 112 in the N×M matrix has been shown.

As seen in FIG. 2, there is shown a cross-sectional view of the flash EEPROM (electrically erasable and programmable read-only memory) cells 112. Each of the EEPROM cells is formed of a substrate 114, typically of a p-type conductivity, having embedded therein an $n^+$ drain region 116 and an n-type double-diffused source region 118. The double-diffused source region 118 is formed of a deeply diffused but lightly doped n-junction 120 (phosphorus doped) and a more heavily doped but shallower $n^+$ junction 122 (arsenic doped) embedded within the deep n-junction 120. A relatively thin gate dielectric layer 124 (i.e., oxide of approximately 100 Å thickness) is interposed between the top surface of the substrate 114 and a conductive polysilicon floating gate 126. A polysilicon control gate 128 is insulatively supported above the floating gate 126 by an interpoly dielectric layer 130. A channel region 132 in the substrate 114 separates the drain region 116 and the source region 118.

Further, there is provided a terminal pin 142 for applying a source voltage $V_S$ to the source region 118. A terminal pin 134 is provided for applying a gate voltage $V_G$ to the control gate 128. Finally, the terminal pin 148 is provided for applying a drain voltage $V_D$ to the drain region 116.

The erase operation of the 5 Volt Only flash EEPROM array 110 of FIG. 2 will now be explained with attention to FIGS. 4 and 5. The method for eliminating of cycling-induced electron trapping in the array 110 in accordance with the principles of the present invention is accomplished by utilizing an averaging tunneling field technique. In contrast, the erase operation is different from that of the prior art which uses a waveform depicted in FIGS. 3(a)–3(c) during the erase condition. As a result, the improved erase method of the present invention has a smaller peak substrate current and a tighter threshold $V_T$ distribution after erase.

In order to implement the averaging tunneling field technique of the present invention, all of the control gates (terminal pins 134) of the memory cells 112 are connected via lead line 136 to the output terminal 138 of an automatic memory tester 140. A memory tester 140 is of the type similar to an Analyzer System, Serial BTMA 2500, that is commonly available from Heuristic Physics Laboratories, Inc., Milpitas, Calif. 95035. Further, all of the source region (terminal pins 142) of the memory cells are connected via lead line 144 and load resistor R to the output terminal 146 of the memory tester 140. All of the drain regions (terminal pins 148) of the memory cells are allowed to float, and the substrate 114 thereof are connected to a ground potential.

The memory tester 140 includes a variable power supply VCC for generating a +5 volts on the output terminal pins 146 and a negative ramp generator NEGV2 for generating a negative ramp voltage on the output terminal pin 138. The power supply VCC and the ramp generator NEGV2 can be set to different values over the erase time and are operated by a computer under a stored program. In addition, the memory tester may include other related hardware, purposely omitted for the sake of clarity.

FIGS. 4(a)–4(c) illustrate the waveforms of the voltages generated by the memory tester 140 and applied to the respective terminal pins 134, 142 and 148 of the control gates 128, the sources 118, and the drains 116 in the memory array 110 during the erase operation for one program/erase cycle utilizing the averaging tunneling field technique of the present invention. During the erase operation, tile drains 116 via the terminal pin 148 are allowed to float. A negative ramp voltage is applied to the control gates 128 via the terminal pins 134 so that the negative voltage of approximately −5 volts is initially applied to the control gates and is then gradually decreased at the stepped rate of −0.09 volts per 10 ms. This is defined as a "ramp bias" condition. Thus, it will be noted that after 50 pulses or steps (or 500 ms) the ramp voltage will have reached its final value of approximately −9.5 volts and remains at that level thereafter. Simultaneously, the positive pulse voltage of +5 volts is applied to the sources 118 via the terminal pins 142 during the erase operation.

As a comparison, FIGS. 3(a)–3(c) illustrate the waveforms of the voltages applied to the respective control gates, sources, and the drain in the memory array 110 of FIG. 2 during the erase operation for one cycle in the prior art method. It will be noted that the drains are also allowed to float and that a positive voltage of +5 volts is applied to the sources during the erase operation. However, a higher negative pulse voltage of a constant value (i.e., −8.5 volts) is applied to the control gate during the erase operation. This is referred to as a "constant bias" condition.

In order to demonstrate that the electron trapping rate is significantly lower in the "averaging tunneling field" technique utilizing the "ramp bias" condition than in the "constant bias" condition, measurement of the band-to-band tunneling current ibb flowing through the load resistor R can be used as a monitor of the tunneling field. In other words, the higher the tunneling current ibb the higher will be the tunneling field. It has been determined that the electron trapping rate is a function of both the peak tunneling field and the total erase time. The curve A in FIG. 5 is a plot of the tunneling current ibb under the "constant bias" condition as a function of the erase time. Further, the curve B in FIG. 5 is a plot of the tunneling current ibb under the "ramp bias" condition as a function of the erase time.

It can thus be seen that the tunneling field under the ramp bias condition is lower than the tunneling field under the constant bias condition at the beginning of the erase operation and that the tunneling field under the ramp bias condition is higher than the tunneling field under the constant bias condition at the end of the erase operation. Therefore, by making the peak tunneling field lower but yet maintaining the total erase time to be the same, the much lower electron trapping rate is achieved in this manner.

In order to show that the constant bias condition creates cycling-induced electron trapping, all of the cells 112 in the memory array 110 are operated over a number of program/erase cycles with the constant bias condition. For each cycle, all of the memory cells 112 in the entire memory array are programmed and then erased. As defined herein, an erased cell is one that is below a certain select threshold $V_T$ so as to pass the erase verified mode of operation. After the last cell in the memory array has passed this erase verify condition, the total erase time used for the entire array is plotted as "number of erased pulses." In other words, the total erase time is divided by "10 ms/pulse" so as to obtain the number of pulses. If the memory array cannot be erased within 10 seconds (1,000 pulses), this will be considered a cycling failure.

Figure 6:
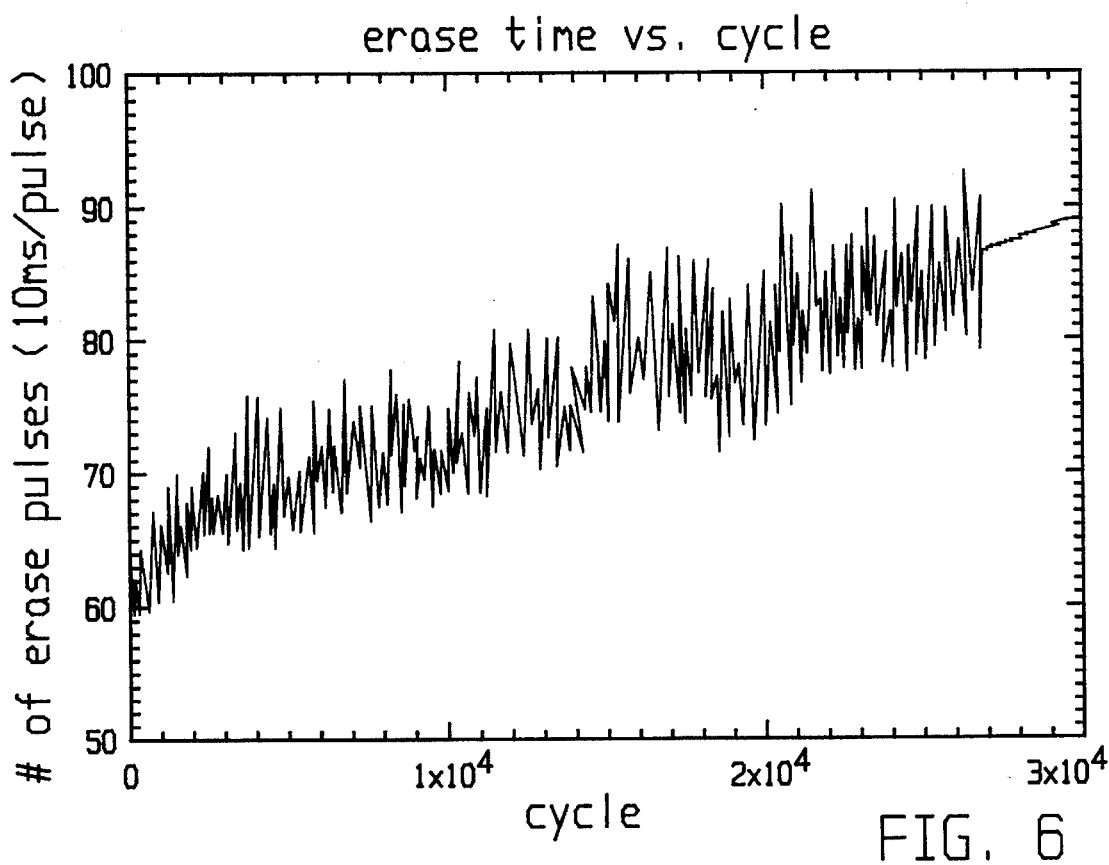
FIG. 6 is a plot of the number of pulses as a function of the number of cycles with the waveforms of FIG. 3 being applied.

Accordingly, FIG. 6 is a plot of the number of erase pulses as a function of the number of program/erase cycles with the constant bias condition. It will be noted that the number of erase pulses increases from about 60 to 85 over approximately 30,000 cycles. This increase in the number of erase pulses is an indication of the cycling-induced electron trapping in the tunneling oxide.

Figure 7:
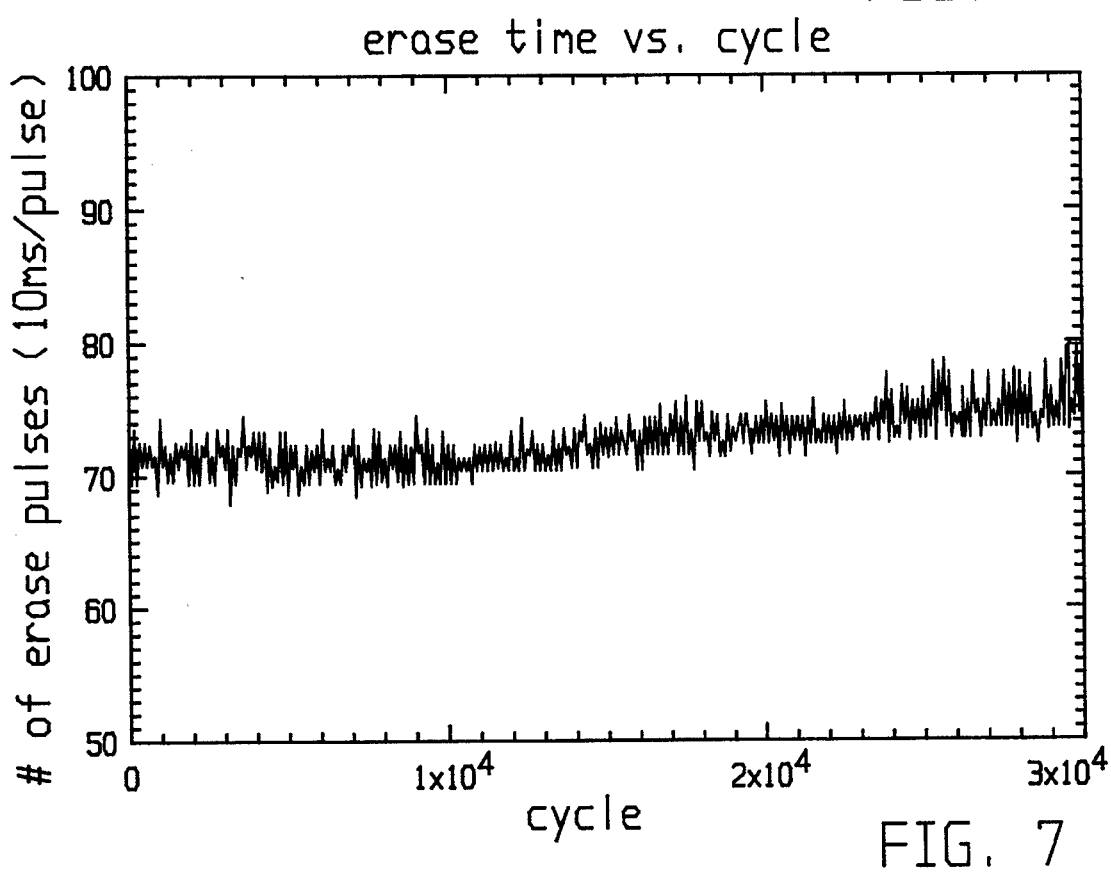
FIG. 7 is a plot of the number of erase pulses as a function of the number of cycles with the waveforms of FIG. 4 being applied.

Similarly, FIG. 7 is a plot of the number of erase pulses as a function of the number of program/erase cycles with the ramp bias condition. It can be seen that the number of erase pulses remains substantially the same or at approximately 70 over the 30,000 cycles. Therefore, the problem of cycling-induced electron trapping can be seen to have been reduced significantly or substantially eliminated.

Consequently, the averaging tunneling field technique of the present invention has now been shown to eliminated the problem of cycling-induced electron trapping in the tunneling oxide. This has been accomplished by applying a negative ramp voltage on the control gate simultaneously with a relatively low positive pulse voltage on the source region. Alternatively, a positive ramp voltage can be applied to the source region in combination with a relatively low negative pulse voltage applied to the control gate.

If the alternate technique of applying a relatively low negative pulse voltage to the control gate and simultaneously applying a positive ramp voltage to the source region is used, the low negative pulse voltage has a magnitude of −5 volts. Also, the positive ramp voltage has an initial magnitude of +5 volts and is then gradually increased at the stepped rate of +0.05 volts per 10 ms. This positive ramp voltage will reach its final value of +7.5 volts after 500 ms and will remain at that level thereafter. It should be apparent to those skilled in the art that this positive ramp voltage on the source cannot be simply a mirror image of the negative ramp voltage on the control gate. The reason is because the capacitive coupling coefficient between the source and the floating gate is different from the capacitive coupling coefficient between the control gate and the floating gate. It has also been found that the low negative pulse voltage may have a magnitude of −9.5 volts. In this instance, the positive ramp voltage will have an initial magnitude of +2.5 volts and will then be gradually increased at the stepped rate of +0.04 volts per 10 ms. Again, the positive ramp voltage will reach its final value of +4.5 volts after 500 ms and will remain at that level thereafter.

Further, the novel erase method reduces significantly the peak tunneling, band-to-band and F-N tunneling currents and provides a smaller variation or narrower distribution of the threshold voltage $V_T$ after erase as compared to the conventional erase method and thus enhances its performance. This tighter $V_T$ distribution after erase provided by this novel erase technique will render a smaller column leakage after erase. In addition, the improved erase method of the present invention leaves the flash EEPROM array free from the disadvantage of requiring a special charge pumping circuit for boosting the power supply voltage to the requisite erase level, thereby significantly enhancing the feasibility of "edge" Fowler-Nordheim (F-N) tunneling erase technology.

From the foregoing detailed description, it can thus be seen that the present invention provides an improved method for eliminating of cycling-induced electron trapping in the tunneling oxide of flash EEPROM devices. The erase method of the present invention provides an averaging tunneling field throughout the entire erase duration. This is achieved by applying a negative ramp voltage on the control gate simultaneously with relatively low positive pulse voltage on the source region.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments failing within the scope of the appended claims.

What is claimed is:

1. A method for eliminating of cycling-induced electron trapping in the tunneling oxide of flash EEPROM devices, said method comprising the steps of:

applying a relatively low positive pulse voltage to a source region of said EEPROM devices during an entire erase cycle; and simultaneously applying a negative ramp voltage to a control gate of said EEPROM devices during the entire erase cycle so as to accomplish an averaging tunneling field from the beginning of the erase cycle to the end of the erase cycle.

2. A method as claimed in claim 1, wherein said low positive pulse voltage has a magnitude of +5 volts.

3. A method as claimed in claim 2, wherein said negative ramp voltage has an initial magnitude of −5 volts and is gradually decreased to the magnitude of −9.5 volts at the rate of approximately −0.09 volts per 10 ms.

4. A method as claimed in claim 3, wherein said negative ramp voltage remains as −9.5 volts after 500 ms.

5. A method for eliminating of cycling-induced electron trapping in the tunneling oxide of flash EEPROM devices, said method comprising the steps of:

applying a relatively low negative pulse voltage to a control gate of said EEPROM devices during an entire erase cycle;

simultaneously applying a positive ramp voltage to a source region of said EEPROM devices during the entire erase cycle so as to accomplish an averaging tunneling field from the beginning of the erase cycle to the end of the erase cycle; and applying said positive ramp voltage with an initial magnitude of +5 volts and gradually increasing the magnitude to +7.5 volts at the rate of approximately +0.05 volts per 10 ms.

6. A method as claimed in claim 5, wherein said low negative pulse voltage has a magnitude of −5 volts.

7. A method as claimed in claim 5, wherein said positive ramp voltage remains as +7.5 volts after 500 ms.

8. A method for eliminating of cycling-induced electron trapping in the tunneling oxide of flash EEPROM devices, said method comprising the steps of:

applying a relatively low negative pulse voltage to a control gate of said EEPROM devices during an entire erase cycle;

simultaneously applying a positive ramp voltage to a source region of said EEPROM devices during the entire erase cycle so as to accomplish an averaging tunneling field from the beginning of the erase cycle to the end of the erase cycle; and applying said positive ramp voltage with an initial magnitude of +2.5 volts and gradually increasing the magnitude to +4.5 volts at the rate of approximately +0.04 volts per 10 ms.

9. A method as claimed in claim 8, wherein said low negative pulse voltage has a magnitude of −9.5 volts.

10. A method as claimed in claim 8, wherein said positive ramp voltage remains at +4.5 volts after 500 ms.

* * * * *